United States Patent
Matsubara et al.

(10) Patent No.: US 10,872,782 B2
(45) Date of Patent: Dec. 22, 2020

(54) METHOD OF MANUFACTURING SEMICONDUCTOR DEVICE

(71) Applicant: TOSHIBA MEMORY CORPORATION, Minato-ku (JP)

(72) Inventors: Yuya Matsubara, Yokkaichi (JP); Hiroshi Kubota, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/561,909

(22) Filed: Sep. 5, 2019

(65) Prior Publication Data
US 2020/0294811 A1 Sep. 17, 2020

(30) Foreign Application Priority Data
Mar. 15, 2019 (JP) .................... 2019-048951

(51) Int. Cl.
*H01L 21/311* (2006.01)
*H01L 21/28* (2006.01)
*H01L 27/11582* (2017.01)

(52) U.S. Cl.
CPC ... *H01L 21/31144* (2013.01); *H01L 21/31111* (2013.01); *H01L 27/11582* (2013.01); *H01L 29/40117* (2019.08)

(58) Field of Classification Search
CPC .............................................. H01L 21/31144
See application file for complete search history.

(56) References Cited

U.S. PATENT DOCUMENTS

| 9,184,060 | B1 | 11/2015 | Lee |
| 9,620,366 | B2 | 4/2017 | Nakao et al. |
| 9,754,793 | B2 * | 9/2017 | Nakao ............... H01L 21/3065 |
| 9,852,907 | B2 | 12/2017 | Watanabe et al. |

FOREIGN PATENT DOCUMENTS

| JP | 2016-105465 A | 6/2016 |
| JP | 2017-5178 A | 1/2017 |
| JP | 2017-160488 A | 9/2017 |

* cited by examiner

*Primary Examiner* — Yu-Hsi D Sun
(74) *Attorney, Agent, or Firm* — Oblon, McClelland, Maier & Neustadt, L.L.P.

(57) ABSTRACT

In one embodiment, a method of manufacturing a semiconductor device includes forming a stacked film on a substrate. The method further includes forming, on the stacked film, a mask layer formed of a tungsten compound and including impurity atoms having a concentration of $1.0 \times 10^{20}$ atoms/$cm^3$ or more. The method further includes etching the stacked film using the mask layer as an etching mask.

20 Claims, 3 Drawing Sheets

METHOD OF MANUFACTURING SEMICONDUCTOR DEVICE

CROSS REFERENCE TO RELATED APPLICATION

This application is based upon and claims the benefit of priority from the prior Japanese Patent Application No. 2019-048951, filed on Mar. 15, 2019, the entire contents of which are incorporated herein by reference.

FIELD

Embodiments described herein relate to a method of manufacturing a semiconductor device.

BACKGROUND

When a metal layer is formed on a wafer as a hard mask layer for etching, there arises a problem that the wafer warps due to the metal layer.

DETAILED DESCRIPTION

In one embodiment, a method of manufacturing a semiconductor device includes forming a stacked film on a substrate. The method further includes forming, on the stacked film, a mask layer formed of a tungsten compound and including impurity atoms having a concentration of $1.0\times10^{20}$ atoms/cm$^3$ or more. The method further includes etching the stacked film using the mask layer as an etching mask.

Embodiments will now be explained with reference to the accompanying drawings.

First Embodiment

FIGS. 1A to 2C are cross-sectional views showing a method of manufacturing a semiconductor device of a first embodiment. The semiconductor device of the present embodiment is, for example, a three-dimensional stacked memory.

Figure 1A:
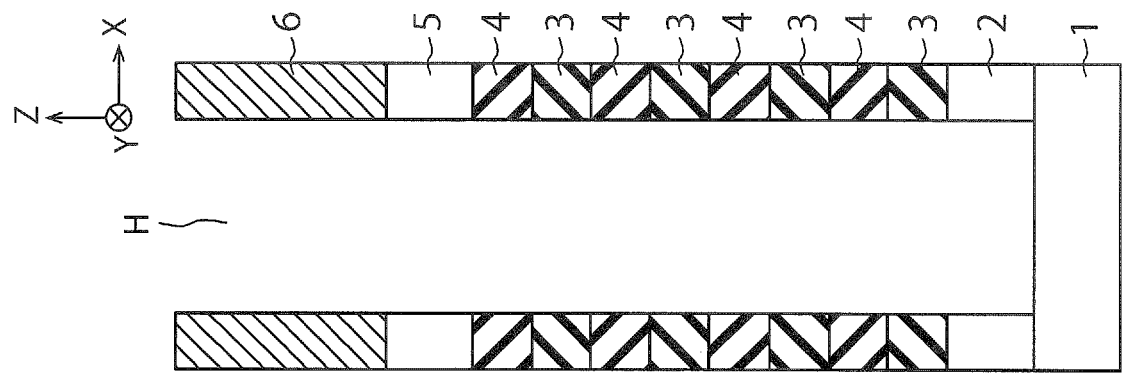
FIGS. 1A to 2C are cross-sectional views showing a method of manufacturing a semiconductor device of a first embodiment.

First, a lower layer 2 is formed on a substrate (wafer) 1, and a stacked layer alternately including a plurality of insulating layers 3 and a plurality of sacrificial layers 4 is formed on the lower layer 2 (FIG. 1A). Next, an upper layer 5 is formed on this stacked layer, and a hard mask layer 6 is formed on the upper layer 5 (FIG. 1A). The lower layer 2, the plurality of insulating layers 3, the plurality of sacrificial layers 4 and the upper layer 5 are an example of a stacked film, and the hard mask layer 6 is an example of a mask layer. Moreover, each insulating layer 3 is an example of a first layer constituting the stacked film, and each sacrificial layer 4 is an example of a second layer constituting the stacked film.

The substrate 1 is, for example, a semiconductor substrate such as a silicon (Si) substrate. FIG. 1A shows an X-direction and a Y-direction which are parallel to the surface of the substrate 1 and perpendicular to each other, and a Z-direction perpendicular to the surface of the substrate 1. In the specification, the +Z-direction is regarded as the upward direction, and the −Z-direction is regarded as the downward direction. The −Z-direction may coincides with the direction of gravity or does not have to coincide with the direction of gravity.

The lower layer 2 includes, for example, an insulator such as a silicon oxide film (SiO$_2$) and a silicon nitride film (SiN), and/or a conducting layer formed between insulators. The insulating layer 3 is, for example, a silicon oxide film, and the sacrificial layer 4 is, for example, a silicon nitride film. The upper layer 5 includes, for example, an insulator such as a silicon oxide film and a silicon nitride film, and/or a conducting layer formed between insulators.

The hard mask layer 6 is formed, for example, of a tungsten compound, and contains impurity atoms other than that. Examples of the tungsten compound include a WB alloy, a WC alloy, a WBC alloy and the like (W denotes tungsten, B denotes boron, and C denotes carbon). Examples of the impurity atoms include halogen atoms such as F (fluorine) atoms, Cl (chlorine) atoms and the like.

The hard mask layer 6 of the present embodiment is exemplarily a WBC film containing F atoms as the impurity atoms. The aforementioned WBC film containing F atoms is formed as an amorphous film, for example, by plasma Chemical Vapor Deposition (CVD) using WF$_6$ gas, B$_2$H$_6$ gas, C$_3$H$_6$ gas and H$_2$ gas (H denotes hydrogen). This plasma CVD is performed, for example, in a CVD apparatus under a pressure of 10 Torr or less. As above, the hard mask layer 6 is formed on the upper layer 5.

The hard mask layer 6 of the present embodiment is formed to contain the impurity atoms having a concentration of $1.0\times10^{20}$ atoms/cm$^3$ or more. Thereby, the substrate 1 can be suppressed from warping caused by the hard mask layer 6. Therefore, according to the embodiment, the hard mask layer 6 can be made thick while suppressing the substrate 1 from warping. The thickness of the hard mask layer 6 is, for example, 1 to 3 μm. The concentration of the impurity atoms in the hard mask layer 6 is desirably $4.0\times10^{20}$ atoms/cm$^3$ or less. In the present embodiment, as the hard mask layer 6, the WBC film that contains F atoms having the concentration of $1.0\times10^{20}$ atoms/cm$^3$ or more and $4.0\times10^{20}$ atoms/cm$^3$ or less is formed. More details of the hard mask layer 6 are mentioned later.

Figure 1B:
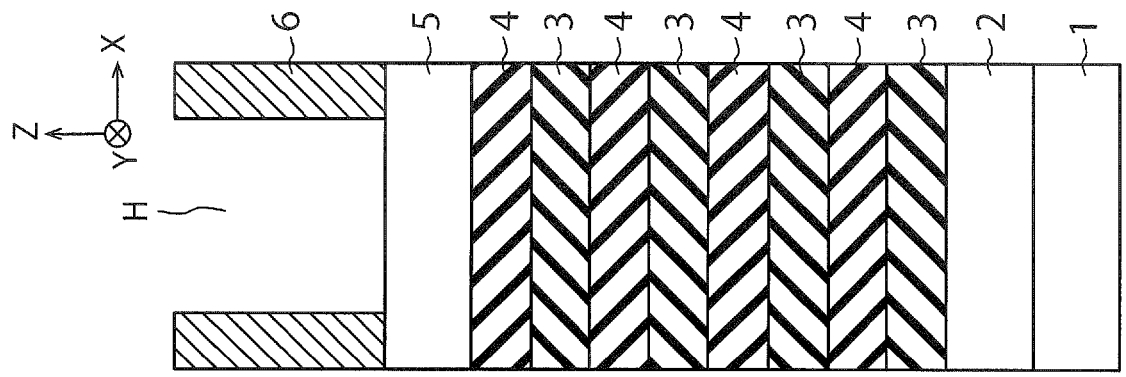

Next, the hard mask layer 6 is processed to be an etching mask by lithography and etching (FIG. 1B). As a result, a hole H for forming a memory hole of the three-dimensional stacked memory is formed in the hard mask layer 6 (FIG. 1B).

Figure 1C:
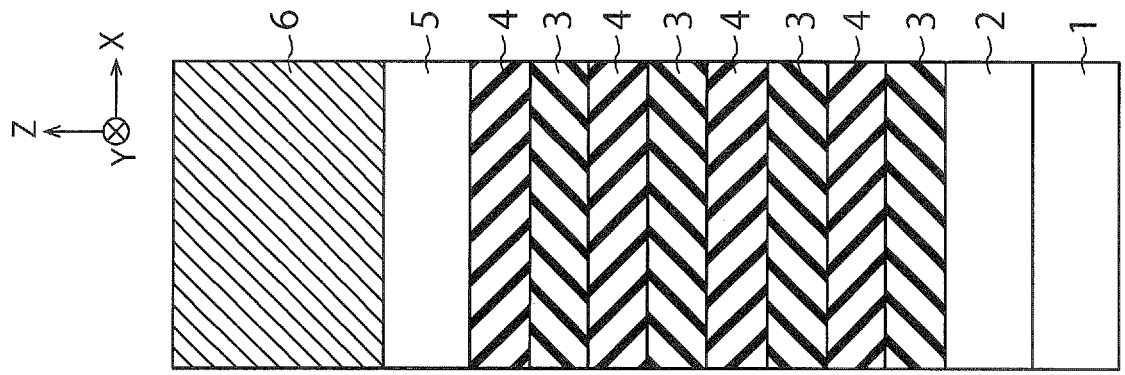

Next, the hole H is processed so as to penetrate the upper layer 5, the plurality of sacrificial layers 4, the plurality of insulating layers 3, and the lower layer 2 by etching using the hard mask layer 6 as the etching mask (FIG. 1C).

Figure 2C:
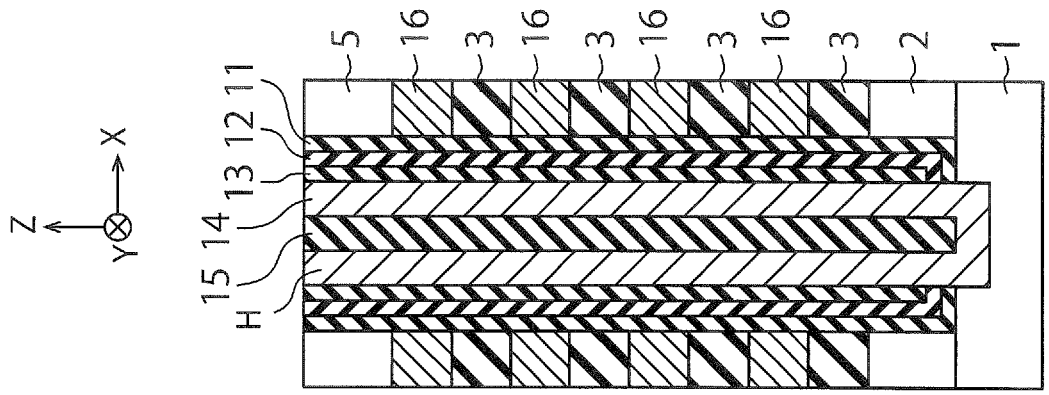
Figure 2B:
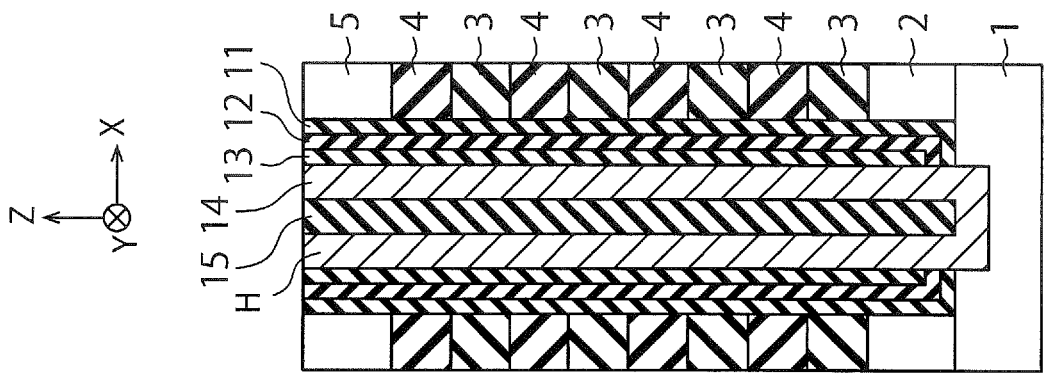
Figure 2A:
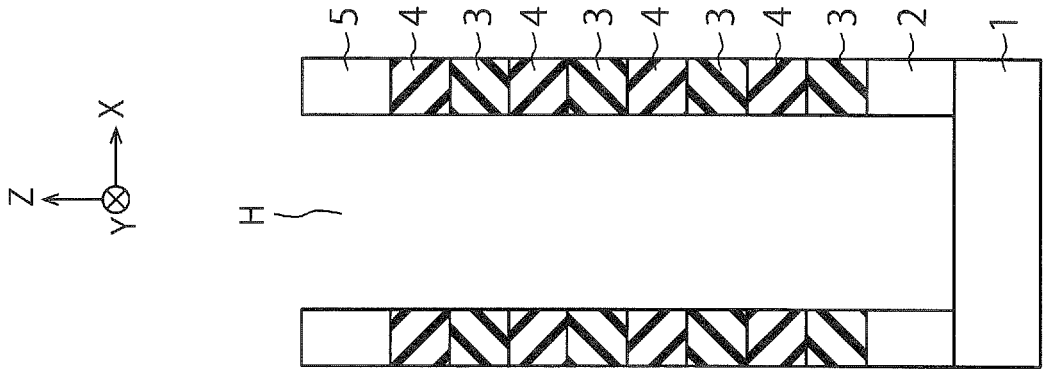

Next, the hard mask layer 6 on the upper layer 5 is removed (FIG. 2A). The hole H that is shown in FIG. 2A is used as the memory hole of the three-dimensional stacked memory. This hole H is, for example, a concave portion in the stacked film.

Next, a block insulator 11, a charge storage layer 12 and a tunnel insulator 13 are sequentially formed in the hole H (FIG. 2B). Next, the block insulator 11, the charge storage layer 12 and the tunnel insulator 13 are removed from a bottom part of the hole H, and a channel semiconductor layer 14 and a core insulator 15 are sequentially formed in the hole H (FIG. 2B). The charge storage layer 12 is, for example, a silicon nitride film. The channel semiconductor layer 14 is, for example, a polysilicon layer. The block insulator 11, the tunnel insulator 13 and the core insulator 15 are, for example, silicon oxide films or metal insulators.

Next, the plurality of sacrificial layers 4 are replaced by a plurality of electrode layers 16 (FIG. 2C). This replacement is, for example, performed by the following procedure. First, the sacrificial layers 4 are removed by wet etching to form a plurality of cavities in the aforementioned stacked layer. Next, the electrode layers 16 are embedded in these cavities. As above, the sacrificial layers 4 are replaced by the electrode layers 16. The electrode layers 16 are, for example, tungsten layers, and function as word lines of the three-dimensional stacked memory. Each electrode layer 16 is, for example, a third layer.

After that, various plug layers, line layers, inter layer insulators and the like are formed above the substrate 1. As above, the semiconductor device of the present embodiment is manufactured.

As above, the hard mask layer 6 of the present embodiment is used for processing to obtain the memory hole of the three-dimensional stacked memory. In this case, since the memory hole is deep, there is a concern that the hard mask layer 6 is etched and removed during the processing to obtain the memory hole. Therefore, the hard mask layer 6 of the present embodiment is formed of the tungsten compound and has a large thickness.

However, when the hard mask layer 6 is formed of the tungsten compound and the thickness of the hard mask layer 6 is large, large stress acts on the substrate 1 from the hard mask layer 6, which causes a possibility that the substrate 1 warps. Therefore, in the present embodiment, the hard mask layer 6 is formed of the tungsten compound that contains the impurity atoms in a high concentration. Thereby, the stress acting on the substrate 1 from the hard mask layer 6 can be reduced, and the substrate 1 can be suppressed from warping caused by the hard mask layer 6. Details of this reason are hereafter described.

Figure 3A:
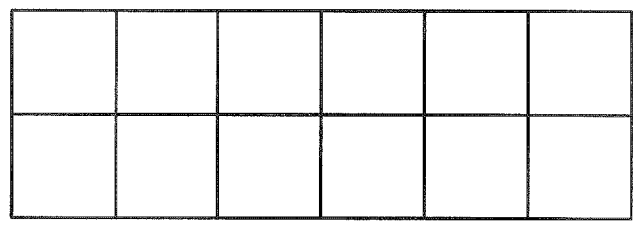
FIGS. 3A and 3B are schematic views for explaining a warp of a substrate of the first embodiment.
Figure 3B:
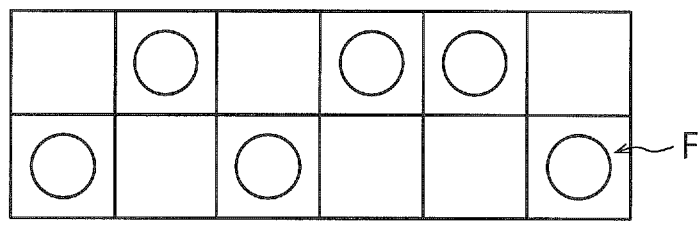

FIGS. 3A and 3B are schematic views for explaining a warp of the substrate 1 of the first embodiment.

FIG. 3A schematically shows a lattice of WBC containing F atoms in a low concentration, and FIG. 3B schematically shows a lattice of WBC containing F atoms in a high concentration. Individual circles shown in FIG. 3B indicate F atoms incorporated in the lattice of WBC.

In general, the stress acting on the substrate 1 from W (tungsten) on the substrate 1 more increases as a concentration of F atoms in W is higher. On the other hand, a result of an experiment showed that the stress acting on the substrate 1 from WBC more decreased as a concentration of F atoms in WBC was higher. Likewise, a result of an experiment showed that the stress acting on the substrate 1 from WB and/or WC more decreased as concentrations of F atoms in WB and/or WC were higher.

This reason is considered as follows. WBC not containing impurity atoms exerts tensile stress on the substrate 1. On the other hand, when WBC contains F atoms, the lattice of WBC expands since the ionic radius of halogen atoms such as F atoms is large. This changes the stress from WBC to the compressive stress side from the tensile stress side. Therefore, when the concentration of F atoms in WBC becomes higher, the tensile stress acting on the substrate 1 from WBC more decreases. This can be considered as the reason that the experimental results as above were obtained. Details of this phenomenon are mentioned later.

Figure 4:
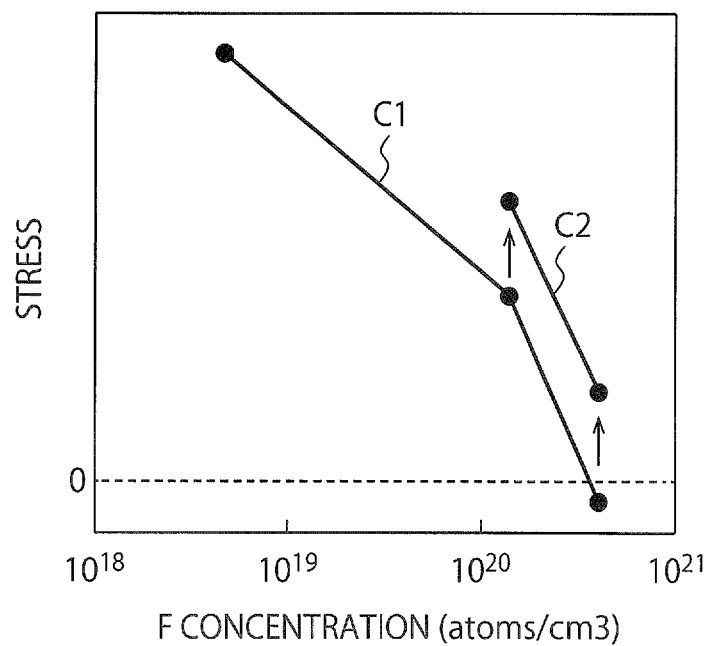
FIG. 4 is a graph for explaining the warp of the substrate of the first embodiment.

FIG. 4 is a graph for explaining the warp of the substrate 1 of the first embodiment.

The graph of FIG. 4 shows relation between a F concentration and stress in the case where the hard mask layer 6 is the WBC film containing F atoms. The horizontal axis indicates the concentration of F atoms in the WBC film. The vertical axis indicates the stress acting on the substrate 1 from the WBC film. Positive stress corresponds to the tensile stress, and negative stress corresponds to the compressive stress.

A curve C1 indicates the stress before annealing of the WBC film. A curve C2 indicates the stress after annealing of the WBC film. As described with reference to FIG. 1A, the WBC film of the present embodiment is formed as the amorphous film. An annealing temperature in the graph of FIG. 4 is 550° C. Since the warp of the substrate 1 is problematic both before annealing of the WBC film and after annealing thereof, the stress of the WBC film is desirably low both before the annealing and after the annealing.

As apparent from the curve C1, the stress decreases to be approximately one half when the F concentration before the annealing increases to $1 \times 10^{20}$ atoms/cm$^3$ from $1 \times 10^{19}$ atoms/cm$^3$. Therefore, in the present embodiment, the F concentration is set to $1.0 \times 10^{20}$ atoms/cm$^3$ or more.

Furthermore, as apparent from the curve C1, the stress changes to being negative from being positive in the middle of the increase of the F concentration before the annealing to $1 \times 10^{21}$ atoms/cm$^3$ from $1 \times 10^{20}$ atoms/cm$^3$. Therefore, when the F concentration is too high, the dimension of the stress results in increasing. Accordingly, in the present embodiment, the F concentration is desirably set to be $4.0 \times 10^{20}$ atoms/cm$^3$ or less. For example, the F concentration is considered to be set within a range of $1.5 \times 10^{20}$ atoms/cm$^3$ to $4.0 \times 10^{20}$ atoms/cm$^3$ or within a range of $2.0 \times 10^{20}$ atoms/cm$^3$ to $4.0 \times 10^{20}$ atoms/cm$^3$.

F atoms may be fed into the WBC film by any method. In the present embodiment, the WBC film containing F atoms is formed by fluorine being incorporated into the WBC film which fluorine is originated from the aforementioned WF$_6$ gas. Namely, the F atoms in the present embodiment are doped into the WBC film in forming the WBC film.

In this case, the concentration of F atoms in the WBC film can be controlled by adjusting conditions of the plasma CVD. In the present embodiment, the F concentration is controlled by regulating a pressure in the CVD apparatus and/or a flow rate of B$_2$H$_6$ gas. In general, when forming the WBC film, the pressure in the CVD apparatus is set to be approximately 16 Torr, and the flow rate of B$_2$H$_6$ gas is set to be approximately 100 sccm. Meanwhile, when forming the WBC film of the present embodiment, for example, the pressure in the CVD apparatus is set to be a low pressure, i.e., 10 Torr or less (for example, 6 Torr), and the flow rate of B$_2$H$_6$ gas is set to be a low flow rate, i.e., less than 100 sccm (for example, 90 sccm). Thereby, the WBC film that has the F concentration of $1.0 \times 10^{20}$ atoms/cm$^3$ to $4.0 \times 10^{20}$ atoms/cm$^3$ can be formed. The reason is considered as that decomposition of WF$_6$ molecules is suppressed due to the low pressure and the low flow rate as above and the WF$_6$ molecules can be easily incorporated into the WBC film.

As above, the hard mask layer 6 of the present embodiment is formed of the tungsten compound, and contains impurity atoms other than that. Therefore, according to the present embodiment, the substrate 1 can be suppressed from warping in the case of forming a metal layer as the hard mask layer 6 above the substrate 1.

While the semiconductor device of the present embodiment is the three-dimensional stacked memory, the hard mask layer 6 of the present embodiment can also be applied to semiconductor devices other than the three-dimensional stacked memory. For example, the hard mask layer 6 of the present embodiment can be employed in the case of forming a hole with a high aspect ratio or a deep trench.

Furthermore, while in the present embodiment, the impurity atoms in the hard mask layer 6 are halogen atoms such as F atoms and Cl atoms, they may be atoms other than those. For example, it can be considered that atoms large in ionic radius similarly to halogens are employed as the impurity atoms.

While certain embodiments have been described, these embodiments have been presented by way of example only, and are not intended to limit the scope of the inventions. Indeed, the novel methods described herein may be embodied in a variety of other forms; furthermore, various omissions, substitutions and changes in the form of the methods described herein may be made without departing from the spirit of the inventions. The accompanying claims and their equivalents are intended to cover such forms or modifications as would fall within the scope and spirit of the inventions.

The invention claimed is:

1. A method of manufacturing a semiconductor device, comprising:
    forming a stacked film on a substrate;
    forming, on the stacked film, a mask layer formed of a tungsten compound and including impurity atoms having a concentration of $1.0\times10^{20}$ atoms/cm$^3$ or more; and
    etching the stacked film using the mask layer as an etching mask.

2. The method of claim 1, wherein the tungsten compound includes tungsten, and includes at least any of boron and carbon.

3. The method of claim 2, wherein the tungsten compound is a WB alloy, a WC alloy or a WBC alloy where W denotes tungsten, B denotes boron, and C denotes carbon.

4. The method of claim 1, wherein the mask layer is formed using a gas that includes tungsten atoms and the impurity atoms.

5. The method of claim 4, wherein the mask layer is formed further using at least any of a gas including boron atoms and a gas including carbon atoms.

6. The method of claim 5, wherein a flow rate of the gas including boron atoms is set to be less than 100 sccm.

7. The method of claim 1, wherein the mask layer includes the impurity atoms having the concentration of $1.0\times10^{20}$ atoms/cm$^3$ or more and $4.0\times10^{20}$ atoms/cm$^3$ or less.

8. The method of claim 1, wherein the mask layer includes the impurity atoms having the concentration of $2.0\times10^{20}$ atoms/cm$^3$ or more.

9. The method of claim 1, wherein the mask layer is an amorphous film.

10. The method of claim 1, wherein a thickness of the mask layer is 1 to 3 μm.

11. The method of claim 1, wherein the mask layer is formed under a pressure of 10 Torr or less.

12. The method of claim 1, further comprising removing the mask layer on the stacked film after etching the stacked film using the mask layer as the etching mask.

13. The method of claim 1, wherein the impurity atoms are halogen atoms.

14. The method of claim 13, wherein the halogen atoms are fluorine atoms or chlorine atoms.

15. The method of claim 1, wherein the impurity atoms are doped into the mask layer in forming the mask layer on the stacked film.

16. The method of claim 1, wherein the stacked film includes a plurality of first layers and a plurality of second layers that are alternately formed on the substrate.

17. The method of claim 16, wherein the first layers are insulating layers, and the second layers are insulating layers different from the first layers.

18. The method of claim 16, further comprising sequentially forming a charge storage layer and a semiconductor layer in a concave portion formed in the stacked film by the etching.

19. The method of claim 18, further comprising:
    forming a plurality of cavities between the first layers by removing the second layers after sequentially forming the charge storage layer and the semiconductor layer in the concave portion; and
    forming a plurality of third layers in the cavities.

20. The method of claim 19, wherein the third layers are electrode layers.

* * * * *